(12) United States Patent
Kanno et al.

(10) Patent No.: US 7,446,256 B2
(45) Date of Patent: *Nov. 4, 2008

(54) THERMOELECTRIC CONVERSION DEVICE, AND COOLING METHOD AND POWER GENERATION METHOD USING THE SAME

(75) Inventors: Tsutomu Kanno, Osaka (JP); Akihiro Sakai, Ibaraki (JP); Akihiro Odagawa, Osaka (JP); Satoshi Okada, Kyoto (JP); Hideaki Adachi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/643,708

(22) Filed: Dec. 22, 2006

(65) Prior Publication Data

US 2007/0102034 A1 May 10, 2007

Related U.S. Application Data

(63) Continuation of application No. PCT/JP2006/314660, filed on Jul. 25, 2006.

(30) Foreign Application Priority Data

Aug. 16, 2005 (JP) ............................. 2005-235738

(51) Int. Cl.
*H01L 35/12* (2006.01)
(52) U.S. Cl. .................... 136/236.1; 136/203; 136/205
(58) Field of Classification Search ......... 136/200–242; 252/62.3 T, 521.2
See application file for complete search history.

(56) References Cited

U.S. PATENT DOCUMENTS

| 7,067,205 B2 | 6/2006 | Adachi et al. |
| 2006/0021646 A1* | 2/2006 | Yotsuhashi et al. ....... 136/236.1 |

FOREIGN PATENT DOCUMENTS

| JP | 9-321346 A | 12/1997 |
| JP | 2001-284662 A | 10/2001 |
| JP | 2002-16297 A | 1/2002 |
| JP | 2003-229605 A | 8/2003 |
| JP | 2005-150534 A | 6/2005 |
| WO | WO 03/085748 A1 | 10/2003 |

OTHER PUBLICATIONS

Yan Zhang, et al., "High-power-density spot cooling using bulk thermoelectrics," Applied Physics Letters, Oct. 4, 2004, pp. 2977-2979, vol. 85, No. 14, American Institute of Physics.

* cited by examiner

*Primary Examiner*—Nam X Nguyen
*Assistant Examiner*—Jeffrey T. Barton
(74) *Attorney, Agent, or Firm*—McDermott Will Emery LLP (57) ABSTRACT

A thermoelectric conversion device of the present invention includes a first electrode, a second electrode, and a layered oxide arranged between the first electrode and the second electrode. The first electrode, the layered oxide, and the second electrode are arranged in this order so that a multilayer is formed. The layered oxide is formed of electric conductive layers and electric insulating layers being alternately arranged. The C axis of the layered oxide is perpendicular to the interface between the first electrode and the layered oxide. The area of the second electrode is smaller than that of the first electrode.

16 Claims, 6 Drawing Sheets

⇒ : Passage of heat
→ : Passage of a carrier

THERMOELECTRIC CONVERSION DEVICE, AND COOLING METHOD AND POWER GENERATION METHOD USING THE SAME

RELATED APPLICATIONS

This application is a continuation of International Application No. PCT/JP2006/314660, filed on Jul. 25, 2006, which in turn claims the benefit of Japanese Patent Application No. 2005-235738, filed on Aug. 16, 2005, the disclosures of which Applications are incorporated by reference herein.

BACKGROUND OF THE INVENTION

1. Field of the Invention

The present invention relates to a thermoelectric conversion device using a thermoelectric conversion material capable of converting between thermal energy and electric energy, and a cooling method and a power generation method using the same.

2. Description of the Related Art

Thermoelectric conversion is a technology using Seebeck effect in which electromotive force is generated when a temperature gradient is provided to a substance, and Peltier effect in which the temperature gradient is generated when an electric current is applied through the substance.

More specifically, the thermoelectric conversion is a technology using the Seebeck effect in which thermoelectric generation occurs when a temperature difference is provided and the Peltier effect in which thermoelectric cooling occurs when an electric current is applied, in a configuration where two kinds of substances each of which is different in carrier polarity, a p-type semiconductor and an n-type semiconductor, for example, are thermally connected in parallel and electrically connected in series.

Under present circumstances, the technology using the thermoelectric conversion is lower in efficiency compared to technologies using other power generation and cooling methods. Therefore, it is used only in a few special applications such as a power sources for remote areas, a power sources for space, a local cooling such as to be used for an electronic device, and a wine cooler.

The performance of a thermoelectric conversion material used for a thermoelectric conversion device is evaluated by a figure of merit Z, or a figure of merit ZT that is made dimensionless by multiplying Z by absolute temperature T.

ZT is a quantity expressed by $ZT=S^2T/\rho\kappa$ where S is a Seebeck coefficient of the substance, $\rho$ is an electric resistivity thereof, and $\kappa$ is a thermal conductivity thereof. A material with a larger ZT value is excellent as the thermal conversion material.

To date, a thermal conversion material mainly used as a practical application, although used in a special application, is a semiconductor of $Bi_2Te_3$.

$Bi_2Te_3$, however, has various problems such as instability at a high temperature, toxicity, scarcity of the element.

Ever since it was discovered that a layered oxide of $Na_xCoO_2$ was a substance that exhibited a good thermoelectric conversion performance (JP 9(1997)-321346 A (reference 1), and WO03/085748 (reference 2)), material searching has been practiced with efforts in order to discover a layered oxide having a higher thermoelectric conversion performance.

The layered oxide has advantages in that it is stable even in the air at high temperature, etc.

Furthermore, as the main characteristics, the layered oxide offers a strong dimensional anisotropy, and most of the layered oxides have a layered crystalline structure (hereinafter, may be referred to as a layered structure) formed of electric insulating layers and second dimensional electric conductive layers that provide electric conduction.

Figure 1:
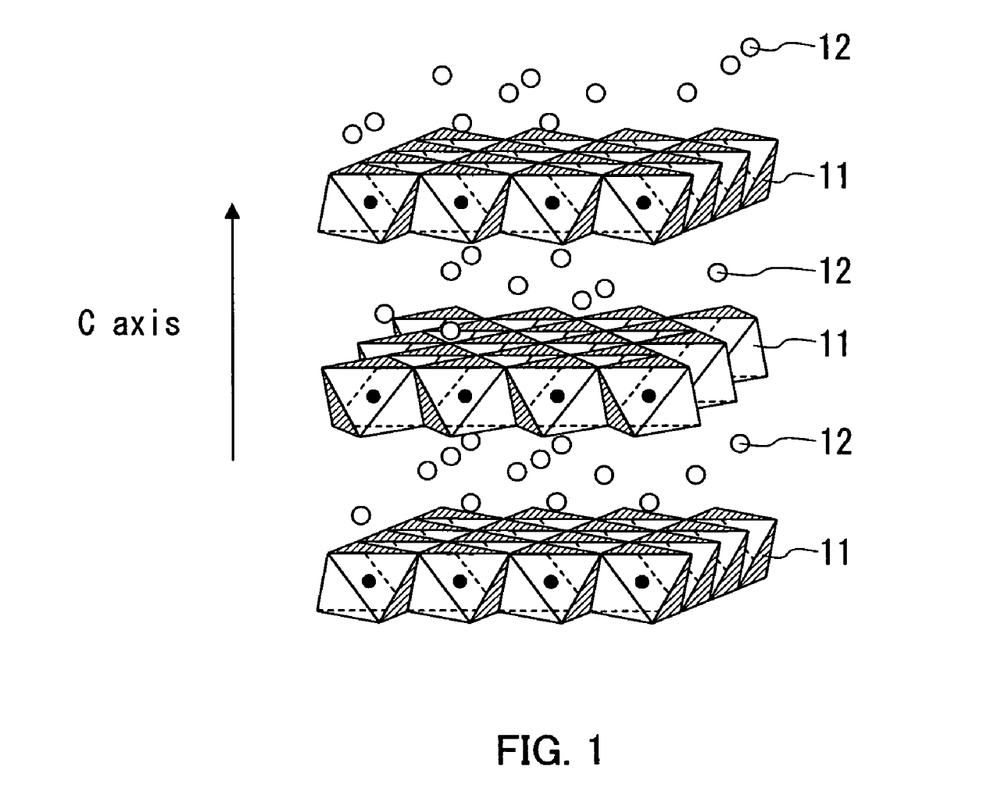
FIG. 1 is a diagram showing one example of a layered oxide used in an embodiment of a thermoelectric conversion device of the present invention, especially, the crystalline structure of the layered oxide in which electric conductive layers and electric insulating layers are stacked one monolayer after another.

FIG. 1 shows the crystalline structure of $Na_xCoO_2$ in which electric conductive layers composed of $CoO_2$ and electric insulating layers composed of Na are stacked in the C axis direction one monolayer after another.

$Na_xCoO_2$ has a strong anisotropy in a thermoelectric property. In $Na_xCoO_2$, $S\perp c/S\|c$ is approximately to 2, $\rho\perp c/\rho\|c$ is approximately to 0.025.

Herein, a Seebeck coefficient and an electric resistivity in a perpendicular direction to the C axis, that is, in a parallel direction to the layered structure (with respect to each layer) are expressed by $S\perp c$ and $\rho\perp c$, respectively. A Seebeck coefficient and an electric resistivity in a parallel direction to the C axis, that is, in a perpendicular direction to the layered structure (with respect to each layer) are expressed by $S\|c$ and $\rho\|c$, respectively.

That is, it is believed that in comparison by ZT, $Na_xCoO_2$ has a better property in the perpendicular direction to the C axis than in the C axis direction.

Therefore, it has been considered advantageous, in view of efficiency, when the thermoelectric conversion device is configured such that a carrier or heat flows in the perpendicular direction to the C axis of the layered oxide, that is, in the parallel direction to the layered structure.

On the other hand, a thermoelectric conversion material produced according to the conventional method is a polycrystal that has no crystalline orientation. Therefore, it is essentially impossible to configure, by using such a polycrystalline material, such that the carrier or the heat flows only in the perpendicular direction to the C axis.

In addition, another factor resulting in performance deterioration is an increase of the electric resistance caused by the carrier being dispersed in crystal grain boundaries that exist in the polycrystalline material in large numbers.

Due to these reasons, it is needed to produce a thermoelectric conversion material of which crystalline orientation is aligned. As methods for producing the thermoelectric conversion material of which crystalline orientation is aligned, in the case of a thin film, for example, there is a method in which the crystalline orientation is controlled by using a single crystalline C-surface substrate of $Al_2O_3$ as a template.

To date, even when $Bi_2Te_3$ and the layered oxide are used, the performance in the conventional device configuration is not satisfactory. It requires a further improvement on the performance of the device for a full-scale practical application in the commercial use.

On the other hand, in addition to the attempts to enhance the ZT of the material itself, there has been an attempt to enhance the efficiency by improving the configuration of a device.

Shakouri et al., have proposed a thermoelectric cooling device in which a cooling-side electrode smaller in area than a radiation-side electrode is arranged (Applied Physics Letters Vol. 85, pp. 2977-2979 (2004) (reference (3)) see).

However, the material used for this thermoelectric cooling device is a material having an isotropic thermoelectric property, and thus, in the above-described configuration, there are no other effects than effects of facilitating an electric current dispersion in the material, and preventing a Joule heat returning. Therefore, the efficiency is improved by several times at most, and a device having sufficient efficiency has not been realized.

As described above, the conventional thermoelectric conversion devices have not demonstrated a satisfactory performance, and have not been able to obtain the efficiency to the extent that it is generally used in a commercial application.

SUMMARY OF THE INVENTION

Therefore, an object of the present invention is to provide a thermoelectric conversion device having high efficiency, and a cooling method and a power generation method using the same.

In order to realize a thermoelectric conversion device with a practical performance, the inventors have laboriously studied on the configuration of a device using a thermoelectric conversion material of a layered oxide. As a result, the inventors acquired unexpected knowledge in which the thermoelectric conversion property can be greatly improved, compared to the conventional thermoelectric conversion device, in a thermoelectric conversion device having electrodes that differ in area from each other being arranged in such a manner as to sandwich the layered structure of a layered oxide. Based on this knowledge, the inventors have arrived at the thermoelectric conversion device of the present invention capable of efficiently exhibiting the thermoelectric conversion effect capability.

A thermoelectric conversion device of the present invention comprises a first electrode, a second electrode, and a layered oxide arranged between the first electrode and the second electrode. The first electrode, the layered oxide, and the second electrode are arranged in this order so that a multilayer is formed. The layered oxide is formed of electric conductive layers and electric insulating layers being alternately stacked. A C axis of the layered oxide is perpendicular to an interface between the first electrode and the layered oxide. An area of the second electrode is smaller than that of the first electrode.

It is noted that in the present invention, the "area of an electrode" means, unless otherwise specified, the area of interfaces formed by the electrode and the layered oxide, that is, contact areas of the electrodes and the layered oxide. Furthermore, in the present invention, the meaning that the C axis of the layered oxide is "perpendicular" to the interface between the first electrode and the layered oxide includes a case that an angle formed by the C axis of the layered oxide and the interface is in a range of such angles that the unique effect of the present invention described below can be obtained. That is, in the present invention, as long as the unique effect of the present invention can be obtained, the angle is "perpendicular". The angle may be in a range of 0° to 15°, for example.

According to the thermoelectric conversion device of the present invention, the unique effect generated by the layered oxide having anisotropic electric conductivity and the electrodes (the first electrode and the second electrode) that differ in area from each other being arranged in such a manner as to sandwich the layered oxide provides a high thermoelectric conversion property. This allows a highly effective thermoelectric conversion that exceeds the conventional performance, thereby a practical thermoelectric conversion device can be realized.

In addition, the conventional thin film element forming process such as a photolithography can be applicable to the thermoelectric conversion device of the present invention, so that it becomes easy to design and produce minute elements. That is, an application of energy conversion between heat and electricity can be facilitated, and thus the present invention is of high industrial value.

A cooling method of the present invention is a method using the above-described thermoelectric conversion device of the present invention. A temperature difference is generated between the first electrode and the second electrode by applying a voltage between the first electrode and the second electrode so that an electric current is passed therethrough, whereby either one of the first electrode or the second electrode is made a low temperature part.

A generating power method of the present invention is a method using the above-described thermoelectric conversion device of the present invention. A potential difference is generated between the first electrode and the second electrode by providing a temperature difference between the first electrode and the second electrode.

DETAILED DESCRIPTION OF THE PREFERRED EMBODIMENTS

Hereinafter, embodiments of the present invention are described with reference to FIGS.

Embodiment 1

Figure 2:
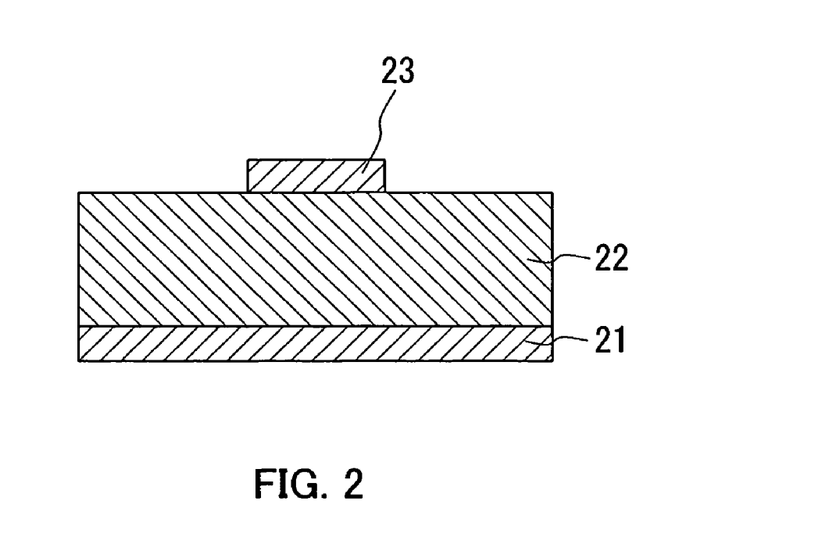
FIG. 2 is a diagram showing the cross sectional configuration of a thermoelectric conversion device in Embodiment 1.

FIG. 2 is a cross sectional view showing the configuration of a thermoelectric conversion device in Embodiment 1 of the present invention.

The thermoelectric conversion device of this embodiment shown in FIG. 2 is formed of a multilayer (stacked body) in which a first electrode 21, a material layer 22, and a second electrode 23 are arranged in this order. The material layer 22 is formed of a layered oxide having a layered crystalline structure. The first electrode 21 and the second electrode 23 are arranged so as to sandwich the layered structure (so as to sandwich the layered structure by surfaces parallel to each layer composing the layered structure).

Hereinafter, unless otherwise specified, the mentioning of "the area of electrodes" represents the area of interfaces formed by the electrode and the material layer 22, that is, contact areas of the electrode and the material layer 22.

The thermoelectric conversion device of this embodiment is characterized in that the area of the second electrode 23 is smaller than that of the first electrode 21.

In order to obtain a large thermoelectric conversion effect, the area of the first electrode 21 is preferably 20 times or more larger than that of the second electrode 23. In other words, the area ratio between the first electrode 21 and the second electrode 23 ((the area of the second electrode)/(the area of the first electrode)) is preferably 0.05 or less, more preferably, $2.0 \times 10^{-3}$ or less, and still more preferably, $5.0 \times 10^{-4}$ or less. In addition, the area ratio between the first electrode 21 and the second electrode 23 is preferably $1.0 \times 10^{-5}$ or more.

Thermoelectric conversion materials having a layered crystalline structure include a layered oxide. Crystallographically, the interlayer direction of crystals of these substances, that is, a direction essentially perpendicular to the layer, is referred to as a C axis direction.

In the thermoelectric conversion device of this embodiment, the material layer 22 is formed of a thin film or a single crystal. In the case of the thin film, the material layer 22 is formed of a C axis-oriented thin film or a single crystalline epitaxial thin film.

In either of the above-described cases, the crystalline orientation is such that the C axis of a crystal is essentially perpendicular to the end surface of the material layer 22 on which the second electrode 23 is arranged.

As FIG. 2 shows, the first electrode 21 and the second electrode 23 are formed so as to sandwich the layered structure of the material layer 22. Upon application of a voltage between the first electrode 21 and the second electrode 23, an electric current is passed in a parallel direction to the C axis of the crystal of the material layer 22, that is, in a perpendicular direction to the layered structure.

This configuration is different from the conventional concept. In the conventional concept, it is believed that the electric current should be passed in the perpendicular direction to the C axis for a better efficiency.

The material of the first electrode 21 is not particularly limited as long as the material has good electric conduction. In the case that the material layer 22 is a thin film, it is preferable to use a material that serves as an origin where the material layer 22 can grow in a C axis orientation or can epitaxially grow in a single crystal.

Specifically, as the material, metals such as Pt, Ti, Au, Cr, Ni, Ir, Ru, etc. of which crystals are oriented, and nitrides or oxides such as TiN, $IrO_2$, $RuO_2$, $SrRuO_3$, ITO (Indium-Tin-Oxide), etc. are preferably used.

The material of the second electrode 23 is not particularly limited as long as the material has good electric conduction. More specifically, as the material, metals such as Pt, Au, Ag, Cu, Al, Ti, Cr, W, etc. and nitrides or oxides such as TiN, $IrO_2$, $RuO_2$, $SrRuO_3$, ITO, etc. are preferably used.

The material layer 22 has a layered crystalline structure, and is a layered oxide of which electric conductivity differs depending on the orientation in the crystal. The layered oxide is more advantageous because of its stability in the air, compared to other thermoelectric conversion materials such as a semiconductor.

Of these materials, a material that has an excellent thermoelectric conversion property is the layered oxide as shown in FIG. 1, for example. In the layered oxide, electric conductive layers 11 and electrical insulating layers 12 are formed so as to be stacked one after another. The electric conductive layer 11 is composed of a crystalline structure formed of $CoO_2$ octahedrons. One example of well known crystalline structures other than a perovskite crystalline structure is a crystalline structure formed of a so-called $CdI_2$-type structure of which layers are formed so that the ridges of the $CoO_2$ octahedrons are shared with each other.

The layered oxide having the $CdI_2$-type structure such as $Na_xCoO_2$ has a higher thermoelectric conversion property compared to other oxides. Therefore, such layered oxide is suitable for constituting the thermoelectric conversion device of this embodiment.

Herein, each layer of the electric insulating layer 12 is spaced apart from each other by one or more atomic layers or oxide layers.

Figure 3:
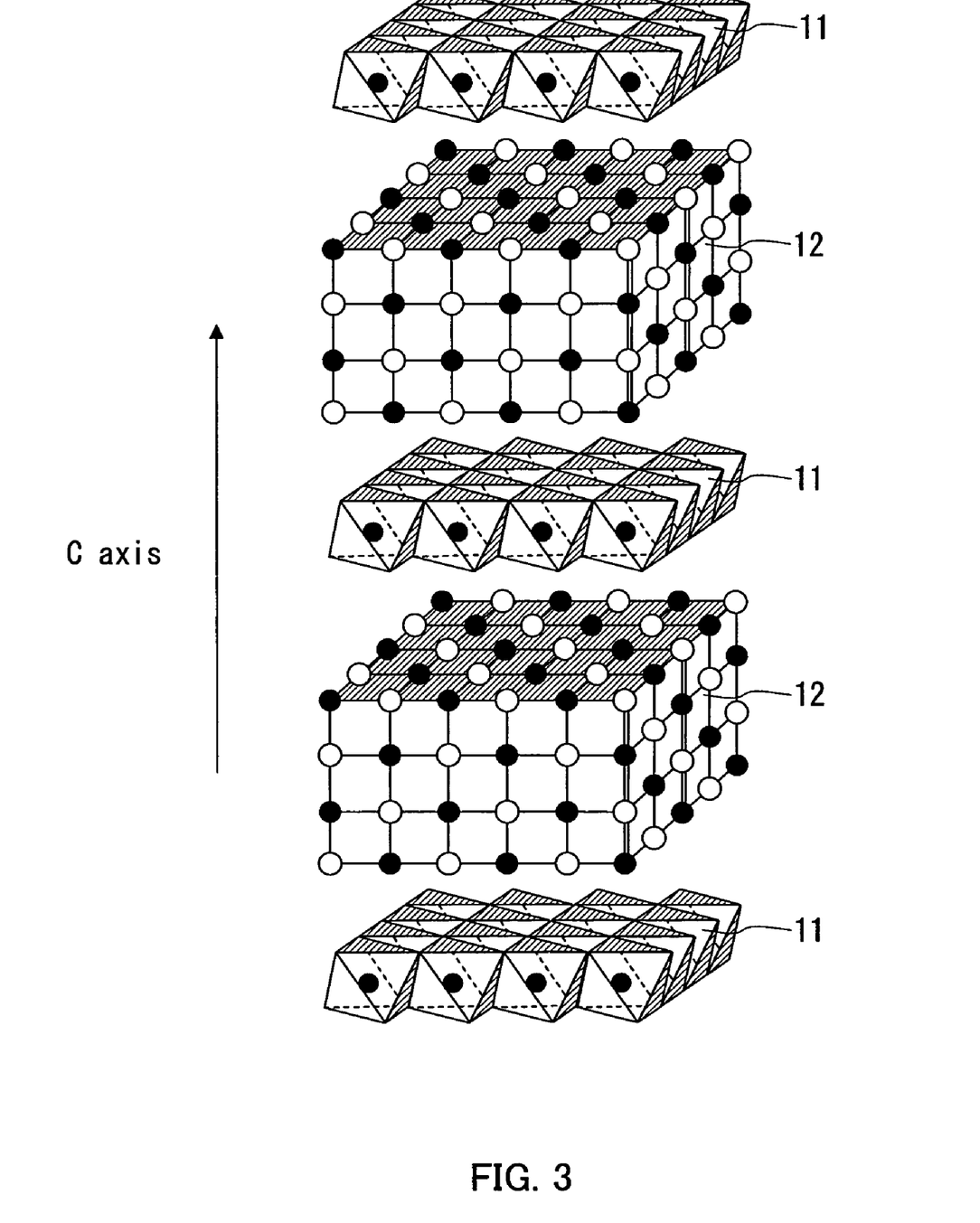
FIG. 3 is a diagram showing another example of the layered oxide used in an embodiment of a thermoelectric conversion device of the present invention, especially, the crystalline structure of a layered oxide in which electric insulating layer is composed of four atomic layers.

More specifically, examples include $Bi_2Sr_2Co_2O_y$, shown in FIG. 3 into which $Sr_2Bi_2O_4$ that is a 4-layered rock salt structure (a rock salt-type insulating layer composed of four atomic layers) as the electric insulating layer 12 is inserted, and $Bi_{2-x}Pb_xSr_2Co_2O_y$, in which one portion of Bi is substituted with Pb for strengthening the stability of the crystal.

Herein, x is not particularly limited as long as it is in such a range that can stably produce the material. Specifically, x is expected to be in a range of $0 \leq x \leq 0.5$.

Although the composition of oxygen is y=8 in a stoichiometric ratio, y is expected to be in a range of $7.5 \leq y \leq 8.5$ due to the reasons that nonstoichiometry is present depending on producing conditions, an oxygen amount is difficult to determine, and others.

The electric insulating layer 12 can be a 3-layered halite structure (a rock salt-type insulating layer composed of three atomic layers). The composition formula of the layered oxide in that case is $((Ca_{1-x1}Sr_{x1})_{1-x2}Bi_{x2})_3Co_4O_y (0 \leq x1 \leq 1, 0 \leq x2 \leq 0.3, 8.5 \leq y \leq 9.5))$.

The ranges of x1, x2, and y are defined by the similar reasons to the above described $Bi_{2-x}Pb_xSr_2Co_2O_y$.

Furthermore, the electric insulating layer 12 can be composed of one layer (one atomic layer), as shown in FIG. 1. The chemical formula of the material layer 22 in this case is expressed by $A_xCoO_2$.

Herein, an element A is composed of at least one element selected from the group consisting of alkaline metals such as Na, K, Li, etc. and alkaline earth metals such as Ca, Sr, Ba, etc.

Furthermore, one portion of the element A may be substituted with Hg, Tl, Pb, Bi.

The electric insulating layer 12 is configured of the element A. The element A is composed of metallic elements such as alkaline metals and alkaline earth metals. Since these elements randomly occupy each site in a crystal at a ratio of 100x %, a diffusion of a carrier often occurs, so that the electric insulating layer 12 has an electric insulating property even when a single metallic element is used.

The x can be artificially adjustable to a certain extent as long as x is in a range of $0.1 \leq x \leq 0.8$.

When O (oxygen) is contained in the electric insulating layer 12, it can be considered to use S (sulfur) and Se (selenium) instead of O (oxygen).

In the above-described layered oxide, one portion of Co may be substituted with at least one element selected from the group consisting of Ni, Ti, Mn, Fe, and Rh.

The amount of oxygen in the layered oxide is preferably as specified in the chemical formula. However, as described with reference to the following chemical formulas, it is difficult to exactly make the amount of oxygen in the layered oxide the same as the amount specified in the chemical formula due to various reasons such as a producing method, and a producing condition in which the thermoelectric conversion device according to the embodiment is actually produced. Thus, in reality, it is assumed that oxygen nonstoichiometry on the order of plus or minus 0.5 exists.

The layered oxide is formed of electric conductive layers 11 and electric insulating layers 12 so that these layers are alternately stacked. The electric conductive layer 11 is formed so that one layer is composed of $MO_2$ (M is a metal such as a transition metal including Mn, Co, and the like, for example) of one to three monolayers. The electric insulating layer 12 is formed so that one layer is composed of one to four monolayers.

It is technically difficult to produce a material layer 22 having an electric conductive layer 11 with a thickness of four or more monolayers, or a material layer 22 having an electric insulating layer 12 with a thickness of five or more monolayers.

According to this configuration, in the case that the carrier is a hole, the application of an electric current from the second electrode 23 to the first electrode 21 in the thermoelectric conversion device shown in FIG. 2 provides the passage of the electric current inside the material layer 22, thereby heat is passed together. As a result, a heat absorption phenomenon occurs on the second electrode 23 side, and a heat generation phenomenon occurs on the first electrode 21 side.

Needless to say, when the direction of an electric current flow is reversed, the heat generation phenomenon occurs on the second electrode 23 side and the heat absorption phenomenon occurs on the first electrode 21 side.

On the other hand, in the case that the carrier is an electron, the application of an electric current from the second electrode 23 to the first electrode 21 in the thermoelectric conversion device shown in FIG. 2 allows the heat generation phenomenon on the second electrode 23 side and the heat absorption phenomenon on the first electrode 21 side.

When the direction of an electric current flow is reversed, the heat absorption phenomenon occurs on the second electrode 23 side and the heat generation phenomenon occurs on the first electrode 21 side.

In either of the above-described cases, the electrode on the heat absorption side becomes a low temperature part.

Conventionally, it has been believed that the electric resistance in the C axis direction of the material layer 22 was large, and the Seebeck coefficient was small, and thus, the thermoelectric conversion performance ZT was too small to be used.

Although details will be described in embodiments below, the present inventors by examining and optimizing various conditions, found that the thermoelectric conversion device of the present invention provides an unexpectedly high thermoelectric conversion performance by making the area of the first electrode 21 larger than that of the second electrode 23. This was discovered in processes of evaluating in detail a relationship between an electrode interface and various kinds of material layers 22 having a layered structure and an anisotropic thermoelectric performance, and a relationship between the thermoelectric conversion performance, and sizes of electrodes and magnitudes of external field to be applied.

One reason for this would be that a Joule heat returning is prevented because of a phenomenon of electric current diffusion, which is similar to the case of the device disclosed in the reference 3. However, the thermoelectric conversion performance achieved by the thermoelectric conversion device of the present invention is incomparably large, and the thermoelectric conversion device of the present invention showed different behavior from the device disclosed in the reference 3. Therefore, it was difficult to understand that such high thermoelectric conversion performance resulted only from the fact that the Joule heat returning was prevented.

The thermoelectric conversion device was produced by arranging the first electrode 21 and the second electrode 23, which differ in area from each other, on a pair of end surfaces parallel to a layer direction of the material layer 22, and by having the material layer 22 sandwiched by the first electrode 21 and the second electrode 23. When an external field such as an electric current is passed between the first electrode 21 and the second electrode 23, a larger thermoelectric conversion performance was confirmed compared to a case that the area of the first electrode 21 and that of the second electrode 23 are the same in size. The use of this effect allows the functioning of the thermoelectric conversion device of this embodiment as a cooling element. That is, the application of a voltage between the first electrode 21 and the second electrode 23 so that the electric current is passed therebetween results in either one of the first electrode 21 or the second electrode 23 being a low temperature part. As a result, it becomes possible to realize a highly effective cooling method using the thermoelectric conversion device of this embodiment.

In the same configuration, the provision of a temperature difference between the first electrode 21 and the second electrode 23 results in movement of a carrier having thermal energy within the material layer 22 between the first electrode 21 and the second electrode 23 so that the temperature difference is eliminated. As a result, the electric current is carried therebetween. That is, the provision of the temperature difference between the first electrode 21 and the second electrode 23 allows the functioning of the thermoelectric conversion device of this embodiment as an electric power generating element.

The use of this effect allows the electric power to be obtained from the present device via the first electrode 21 and the second electrode 23. That is, the provision of the temperature difference between the first electrode 21 and the second electrode 23 provides a highly effective power generation method that uses the thermoelectric conversion device of this embodiment.

As described above, according to the present invention, a high effectiveness can be obtained as a thermoelectric generating device.

The material layer 22 in the thermoelectric conversion device of this embodiment requires that the orientation of a crystalline layer, that is, the orientation of the C axis of the crystal, be aligned.

More specifically, the material layer 22 is preferably a single crystal or an epitaxial thin film. The single crystal of a layered material is made by a generally-used method for producing a single crystal such as a floating zone method, and a flux method.

When the thermoelectric conversion device of the present invention is produced using a thin film process such as a sputtering method, the process becomes simplified by using a base body for supporting the structure of a device.

In this case, the first electrode 21 is firstly formed on the base body, and thereafter, the material layer 22 and the second electrode 23 are formed in this order.

For producing a pattern of the second electrode 23, which is small in area, various methods are used such as a vapor-phase growth of an electrode material and a cream solder coating via a metal mask, and a liftoff, an ion beam etching and an electrolytic plating using a photoresist.

Upon producing the first electrode 21, it is preferable that the material of the base body used for urging a crystalline growth be appropriately selected. In addition, upon producing the material layer 22, a heat temperature at a time of the film formation is important.

When the sputtering method is used, a substrate temperature is preferably in a range of 650° C. to 800° C. in the case of the layered oxide.

The producing method is not particularly limited as long as these conditions are satisfied. Thus, various thin film forming methods can be used such as vapor-phase growth methods including a sputtering method, a vapor deposition method, a laser ablation method, a chemical vapor deposition method, or a growth method from a liquid phase or a solid phase such as an electrode position.

As materials of the base body, single crystalline materials such as $Al_2O_3$, MgO, $SrTiO_3$, $LaAlO_3$, $NdGaO_3$, $YAlO_3$, $LaSrGaO_4$, $LaSrAlO_4$, $MgAl2O_4$, ZnO, YSZ (yttrium stabilized zirconia), $ZrO_2$, TiO (rutile or anatase), $Fe_2O_3$, $Cr_2O_3$, Si, GaAs, etc. are preferable.

When a thick film of the material layer 22 is produced by a liquid phase epitaxial process, and the like, the thick film can be directly grown from the base body surface of the single crystalline material. However, in order to obtain a thick film with a better crystallinity, it is preferable that an initial growth layer of the crystalline thin film be previously formed by a method such as the sputtering method, and thereafter, the thick film is formed. In the liquid phase process, in the case of the $Na_{0.5}CoO_2$ thin film, for example, melt is produced by mixing and melting powders of $Co_3O_4$ and $Na_2CO_3$ at 1000° C. using NaCl as a flux. The thin film together with the base body is impregnated with the melt, which is gradually cooled to 900° C. As a result, the $Na_{0.5}CoO_2$ thick film of approximately 1 mm can be formed.

When the thermoelectric conversion device of this embodiment is used for cooling, the electric current passed is preferably a direct current as opposed to an alternating current. This is because the alternating current does not result in an effective thermal movement but attributes only to heat loss caused by the generation of Joule heat. When, in addition to a constant electric current, a direct pulse current is combined, the thermoelectric conversion can be driven in an efficient manner corresponding to a desired cooling performance.

The material layer 22 is preferably constant in the cross sectional area (hereinafter, referred to as a "cross sectional area") that appears when the material layer 22 is cut along a surface parallel to the substrate surface (that is, the top surface of the first electrode 21) irrespective of the height (that is, the width) of the material layer 22.

The thickness of the material layer 22 can be set to be in a range of 0.1 µm to 1000 µm, for example, and preferably in a range of 50 µm to 200 µm.

Embodiment 2

Figure 4A:
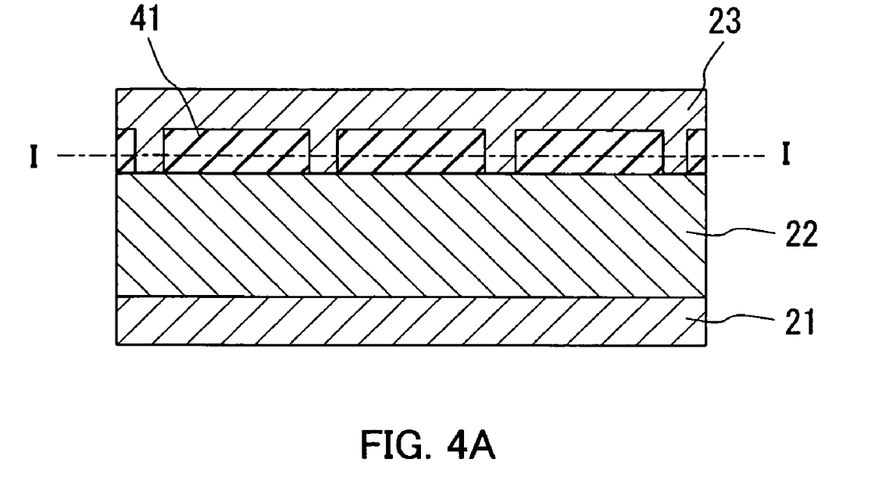
FIG. 4A is a diagram showing the cross sectional configuration of a thermoelectric conversion device in Embodiment 2.
Figure 4B:
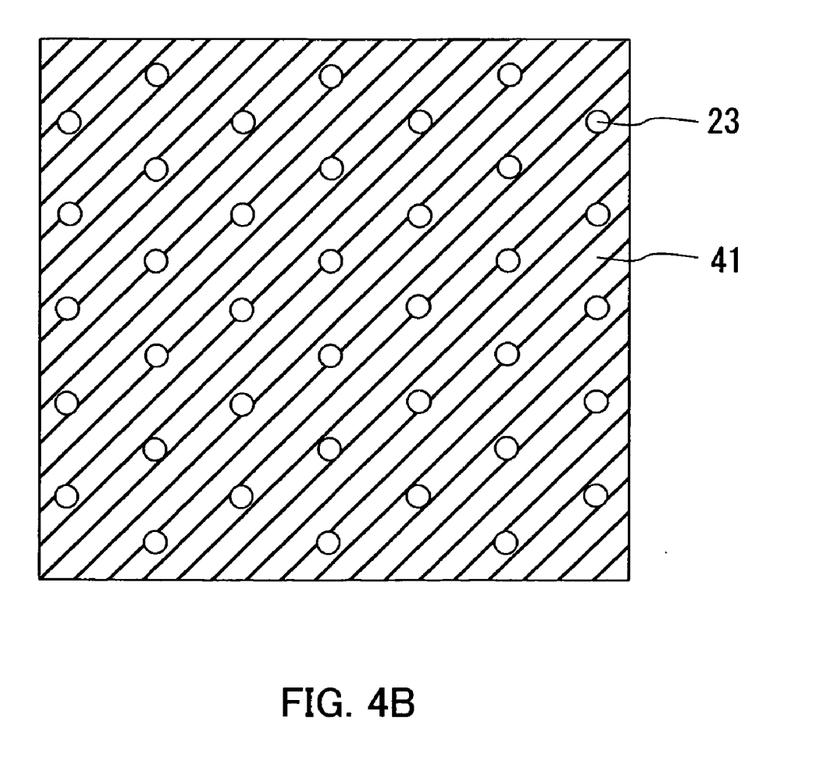
FIG. 4B is a cross sectional view taken along line I to I of FIG. 4A.

FIG. 4A is a cross sectional view showing the configuration of a thermoelectric conversion device in Embodiment 2 of the present invention. FIG. 4B is a diagram showing a cross section (cross section taken along line I to I) cut along the portion instructed in FIG. 4A. It is noted that in FIG. 4B, a hatching of the second electrode 23 is omitted.

In the thermoelectric conversion device of this embodiment, a material layer 22 and a second electrode 23 are in contact at a plurality of regions. In other words, a plurality of second electrodes 23 are arranged on the material layer 22, and each second electrode 23 is formed so as to be electrically connected with each other. Because of such configuration, the thermoelectric conversion device of this embodiment can make an effective area large while a high thermoelectric property is maintained. It is noted that for the sake of convenience for explanation, a plurality of second electrodes 23 which are electrically connected with each other may be generally referred to as the "second electrode 23".

The above-described configuration can be realized by, firstly, forming a insulating interlayer 41 having a plurality of contact hole patterns small in area on the material layer 22, and subsequently, by producing the second electrode 23 thereon. The second electrode 23 is in contact with the material layer 22 via the contact holes formed in the insulating interlayer 41. Thereby, it becomes possible to realize a device that has a high thermoelectric property and a wide effective area.

For producing the first electrode 21, the material layer 22, and the second electrode 23 in this embodiment, the materials and the producing methods described in Embodiment 1 can be applicable. Furthermore, regarding the relationship (area ratio, and the like) between the area (contact area of the material layer 22 and one second electrode 23) of the second electrode 23 and that of the first electrode 21, the similar relationship to the case of Embodiment 1 can be applicable.

Furthermore, as a method of producing the second electrode 23, simple methods such as a plating and a cream solder coating can be used in addition to vapor-phase growth methods such as a sputtering method and a vapor deposition method.

The material of the insulating interlayer 41 is not particularly limited as long as the material has an electric insulating property. A material having a low thermal conductivity is preferably used. The formation of the insulating interlayer 41 of such material effectively provides a temperature difference only in the vicinity of contact points between the material layer 22 and the second electrode 23, and is therefore advantageous.

Examples of insulating materials having a low thermal conductivity include an inorganic porous body such as porous silica, and an organic resin, for example.

Of the organic resins, when photoresist and photosensitive polyimide, in particular, are used, a pattern formation can be easily done with a generally used photolithography method. Therefore, it is advantageous to use the photoresist and the photosensitive polyimide.

When solvent-resistant materials such as most types of the negative-type photoresists and the photosensitive polyimide are used, the configuration can be maintained even after a later process in which solvent is used. Therefore, it is preferable to use the solvent-resistant materials.

When a process such as a vapor deposition with a high straightness of flying particles is used for producing the second electrode 23, a layer coverage of the second electrode 23 in side walls of contact holes may be poor. In this case, when the side walls of the contact holes 51 are sheer as shown in FIG. 5A, a good conductivity may not be obtained.

Figure 5A:
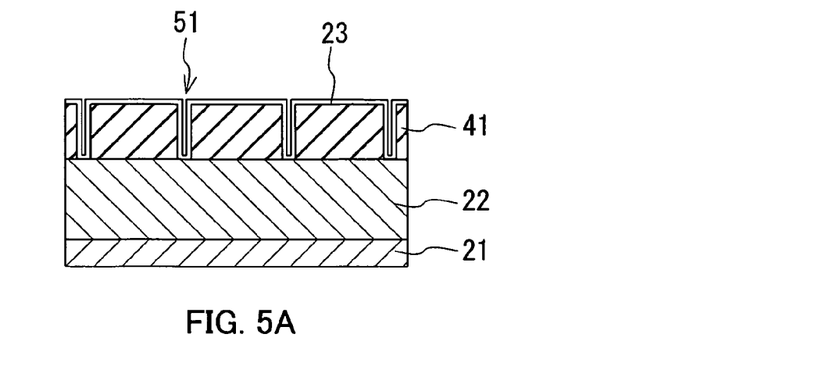
FIGS. 5A to 5D are cross sectional views showing each configuration example of a thermoelectric conversion device having contact holes different in shape, in the thermoelectric conversion device in Embodiment 2.
Figure 5B:
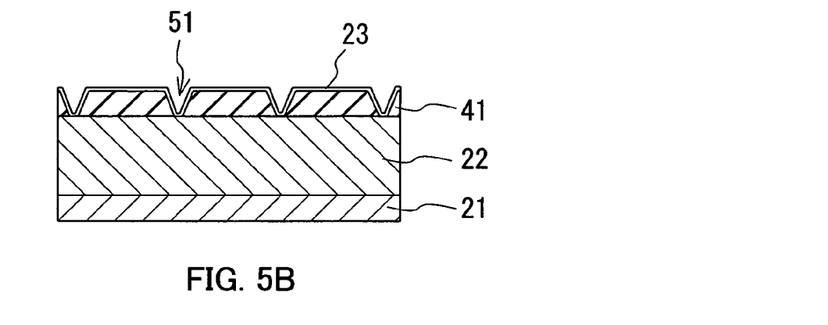

Therefore, when the process with a high straightness is used, the contact holes 51 of which side walls are in a gradual tapered shape may be preferably formed, as shown in FIG. 5B.

There are various methods for producing the contact holes 51 in a tapered shape as shown in FIG. 5B. In the case that the negative-type photosensitive polyimide is used for the insulating interlayer 41, the contact holes 51 of which side walls are tapered can be formed by forming the contact hole pattern according to the above-described process, which is followed by a baking for approximately 30 to 60 minutes at 200 to 350° C. in an inactive gas atmosphere of Ar, $N_2$, and the like.

Figure 5C:
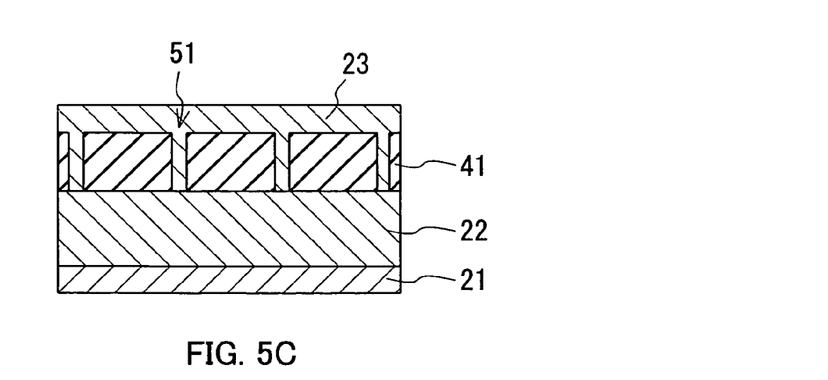
Figure 5D:
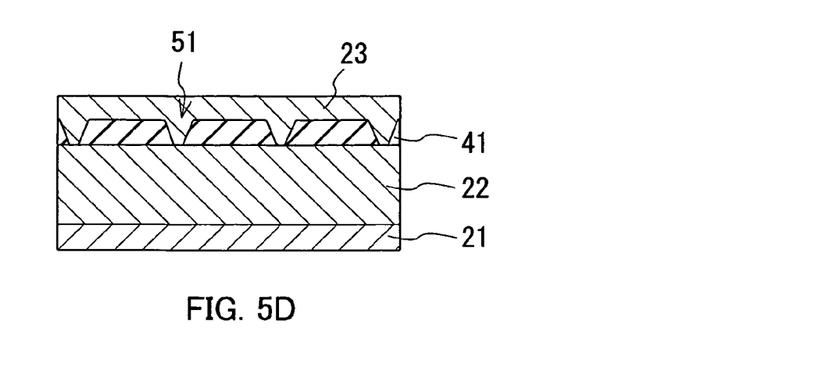

The second electrode 23 can not only be in a thin film shape formed on the surface of the insulating interlayer 41 as shown in FIG. 5A and FIG. 5B but can also be in a thick film shape as shown in FIG. 5C and FIG. 5D. In this case, a CMP (Chemical mechanical polishing), and the like, is used for smoothing the surface, so that an additional functional element such as a censor and the like is formed on the device, thereby, a monolithic device can be produced as a whole.

EXAMPLES

The present invention is described in more detail by using examples.

Example 1

By an RF magnetron sputtering, a thermoelectric conversion device of this example was produced using $Bi_2Sr_2Co_2O_y$, (hereinafter, referred to as "BSCO") having an insulating layer composed of a 4-layered rock salt structure. It is noted that in this example, the thermoelectric conversion device of the configuration shown in FIG. 2 was produced.

Among the layered oxides, BSCO has a relatively large anisotropy. In BSCO, the electric conductivity in an intralayer direction is approximately 10000 times higher than that in an interlayer direction (C axis direction).

Pt of 200 nm in thickness was used as a lower electrode, which is the first electrode 21. BSCO of 5 μm in thickness was used as the material layer 22. Au of 1000 nm in thickness was used as an upper electrode, which is the second electrode 23.

Ideally, the y value in BSCO is y=8. However, depending on forming conditions, oxygen nonstoichiometry on the order of plus or minus 0.5 may occur. Therefore, y is considered to be in a range of $7.5 \leq y \leq 8.5$.

As a substrate, a C-surface substrate of sapphire $Al_2O_3$ that was 10 mm square and 500 μm in thickness was used.

The first electrode 21 (Pt) was formed on the entire surface ($1.0 \times 10^8$ μm² in area) of the substrate. The conditions for forming the first electrode 21 were as follows: a substrate temperature was 650° C.; a gas pressure at a time of growth was 1 Pa; an atmosphere gas was composed solely of Ar; and an input electric power was 80 W. The evaluation results of an X-ray diffraction revealed that Pt was epitaxially grown in a (111) orientation.

The conditions for forming the material layer 22 composed of BSCO were as follows: a substrate temperature was 650° C.; a gas pressure at a time of growth was 5 Pa; and an input electric power was 60 W under a mixed gas atmosphere of 80% Ar and 20% $O_2$ (in a partial pressure ratio).

After completion of the coating, the inside of the sputtering device was set to 81 kPa (0.8 atm) of a pure oxygen atmosphere. It took five hours to cool the sample to room temperature.

Figure 6:
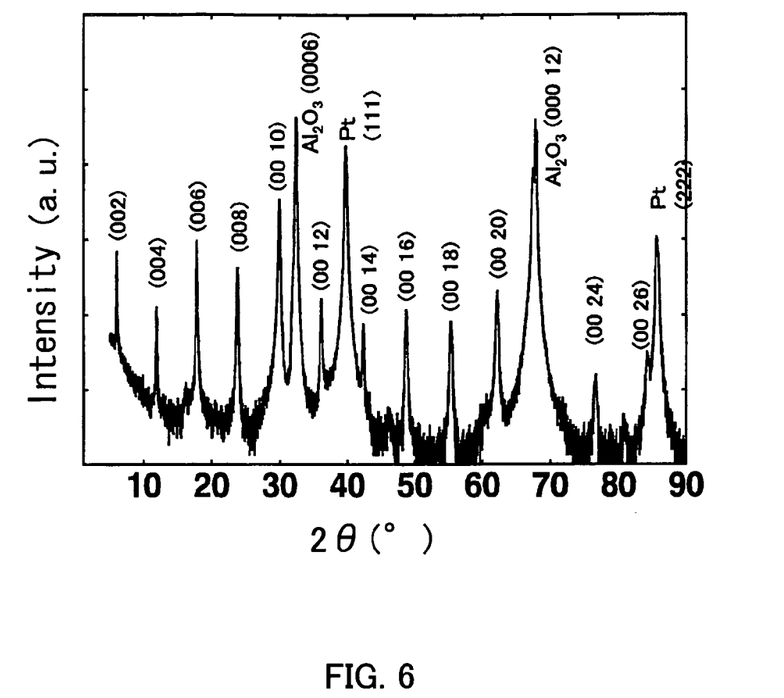
FIG. 6 is a graph showing an X-ray diffraction pattern of a $Bi_2Sr_2Co_2O_y$ thin film used in the thermoelectric conversion device in Embodiment 1.
Figure 7:
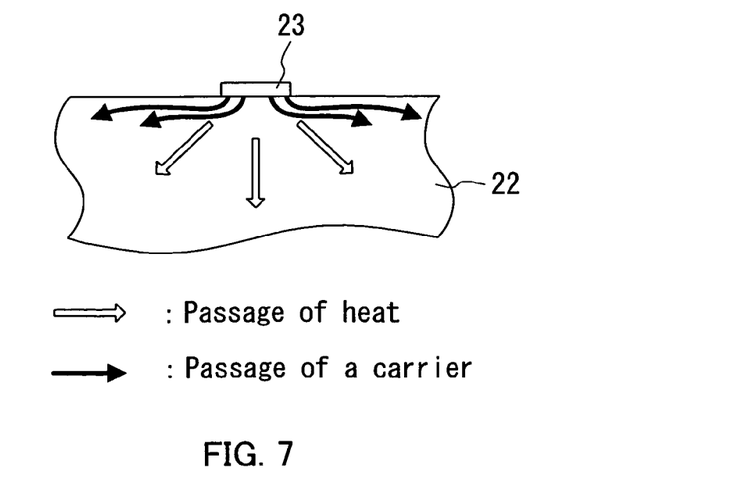
FIG. 7 is a diagram schematically showing passages of a carrier and heat in the thermoelectric conversion device in Embodiment 1.

The evaluation results of an X-ray diffraction shown in FIG. 6 revealed that BSCO was a single crystalline thin film that was epitaxially grown in the (001) orientation. That is, the layered structure of BSCO was parallel to the substrate surface (in-plane direction of each layer in BSCO was parallel to the substrate surface).

The conditions for forming the second electrode 23 (Au) were as follows: a substrate temperature was room temperature, a gas pressure at a time of growth was 1 Pa, an atmosphere gas was composed solely of Ar, and an input electric power was 80 W.

In this case, the film forming was performed via a metal mask having one circular hole. A total of four samples of 30 μm, 50 μm, 100 μm, and 500 μm in electrode diameter, that is, $7.1 \times 10^2$ μm², $2.0 \times 10^3$ μm², $7.9 \times 10^3$ μm², and $2.0 \times 10^5$ μm² in area respectively (Examples 1-1 to 1-4) were produced.

As a comparative example, a sample in which the second electrode 23 (Au) was formed on the entire surface area ($1.0 \times 10^8$ μm² in area) of BSCO was produced without using the metal mask (Comparative Example 1-1).

As other comparative examples, Pt (100)-oriented thin films were formed on A-surface substrates of $Al_2O_3$, and the BSCO thin films were grown on top thereof.

The evaluation results of an X-ray diffraction revealed that BSCO was a (100)-oriented thin film.

That is, the layered structure of BSCO was perpendicular to the substrate surface (in-plane direction of each layer in BSCO was perpendicular to the substrate surface) (also see WO05/083808).

Regarding the second electrodes 23 (Au), which are the upper electrodes, similar to the cases of Examples 1-1 to 1-4, samples of 30 μm, 50 μm, 100 μm, and 500 μm in diameter, that is, $7.1 \times 10^2$ μm², $2.0 \times 10^3$ μm², $7.9 \times 10^3$ μm², and $2.0 \times 10^5$ μm² in area respectively (Comparative Examples 1-2 to 1-5) were produced.

Regarding the samples of Examples 1-1 to 1-4 and Comparative Examples 1-1 to 1-5 thus produced, a constant electric current in a range of 0.01 mA to 100 mA was applied between the first electrode 21 and the second electrode 23. Cooling temperatures at a time of cooling the second electrode 23 were evaluated.

The results are shown in Table 1.

TABLE 1

| Samples | Orientation of an electrode interface to layered structure | Area ratio between first electrode 21 and the second electrode 23 (area of second electrode/area of first electrode) | $\Delta T_{obs}$(K) | $\Delta T_{obs}/\Delta T_{max}$ | $S_{obs}$ (μV/K) |
|---|---|---|---|---|---|
| Ex. 1-1 | parallel | $7.1 \times 10^{-6}$ | 2.025 | 245 | 2190 |
| Ex. 1-2 | parallel | $2.0 \times 10^{-5}$ | 0.899 | 109 | 1463 |
| Ex. 1-3 | parallel | $7.9 \times 10^{-5}$ | 0.301 | 37 | 846 |
| Ex. 1-4 | parallel | $2.0 \times 10^{-3}$ | 0.034 | 4.2 | 286 |
| Comparative Ex. 1-1 | parallel | 1.0 | 0.009 | 1.0 | 140 |
| Comparative Ex. 1-2 | perpendicular | $7.1 \times 10^{-6}$ | 0.013 | 1.44 | 168 |
| Comparative Ex. 1-3 | perpendicular | $2.0 \times 10^{-5}$ | 0.011 | 1.22 | 155 |

TABLE 1-continued

| Samples | Orientation of an electrode interface to layered structure | Area ratio between first electrode 21 and the second electrode 23 (area of second electrode/area of first electrode) | $\Delta T_{obs}$(K) | $\Delta T_{obs}/\Delta T_{max}$ | $S_{obs}$ ($\mu$V/K) |
|---|---|---|---|---|---|
| Comparative Ex. 1-4 | perpendicular | $7.9 \times 10^{-5}$ | 0.010 | 1.11 | 147 |
| Comparative Ex. 1-5 | perpendicular | $2.0 \times 10^{-3}$ | 0.009 | 1.0 | 140 |

The table 1 also shows the ratio of $\Delta T_{obs}/\Delta T_{max}$ (where $\Delta T_{obs}$ is the maximum cooling temperature that is obtained by applying an electric current to each sample having the second electrode 23 of which diameter differs to each other so that the second electrode 23 was cooled, and $\Delta T_{max}$ is the upper limit of the cooling temperature that is evaluated according to the equation of $\Delta T_{max} = Z_0 T^2/2$ by using the figure of merit $Z_0$ of the material itself), and the effective Seebeck coefficient $S_{obs}$ calculated from $\Delta T_{obs}$.

The Table 1 revealed that there is a tendency that the smaller the size of the second electrode 23, the larger the value of $\Delta T_{obs}$. The larger the value of $\Delta T_{obs}$, the lager the value of the Seebeck coefficient $S_{obs}$.

However, if the size of the second electrode 23 is further smaller than that of this example, resistance between the electrodes becomes large, and therefore, it is expected that the generated temperature difference decreases on reaching a certain size of the second electrode 23.

That is, it is assumed that the size of the second electrode 23 has the optimum value that provides the maximum efficiency.

The optimum size of the second electrode 23 depends upon various conditions such as the film thickness of the material layer 22, electric resistivity, and electric conductivity, and thus, it is difficult to generalize the size. However, since the electric resistivity in the C axis direction is large in BSCO used as the material layer 22 in this example, it is expected that the optimum size of the second electrode 23 may be at least 1 μm or larger in diameter.

When the Seebeck coefficient Ss was estimated by a steady method, that is, a method in which the Seebeck coefficient was calculated by the magnitude of electromotive force generated as a result of applying a slight temperature difference to the specimen, the Seebeck coefficient Ss was approximately 140 μV/K at room temperature.

The $S_{obs}$ of this example improved by approximately 15.6 times compared to Ss (Example 1-1).

Generally, since in the thermoelectric conversion figure of merit ZT, there is a term of the Seebeck coefficient squared. This means that in this example, the performance, in terms of ZT, improved by up to about 240 times.

On the other hand, the $S_{obs}$ in Comparative Examples 1-1 to 1-5 were 140 to 168 μV/K. This means that these values were approximately the same values as the Ss values in the steady method.

These results revealed that the C axis of the material layer 22 (layered oxide), which is typical of BSCO, is perpendicular to the interface between the first electrode 21 and the layered oxide (comparisons between Examples 1-1 to 1-4 and Comparative Examples 1-2 to 1-5), and a very high thermoelectric conversion performance can be realized only when the area of an interface between the first electrode 21 and the material layer 22 and that of an interface between the second electrode 23 and the material layer 22 are different (comparisons between Examples 1-1 to 1-4 and Comparative Example 1-1).

In addition, it is assumed that the $S_{obs}$ in which only the effect generated by diffusion of an electric current discussed in the reference 3 is taken into account is approximately the same as or at most several times better than the $S_{obs}$ evaluated in Comparative Examples (Comparative Examples 1-2 to 1-5). The $S_{obs}$ in this example (Examples 1-1 to 1-4) was far superior.

Furthermore, it was examined how the temperature difference $\Delta T_{obs}$ generated when the cooling was performed by using the thermoelectric conversion device of this example changed with time.

In the case that the sample of Example 1-1 was driven with a constant electric current applied thereto, the generated temperature difference $\Delta T_{obs}$ was gradually alleviated with time. After one minute, the temperature difference $\Delta T_{obs}$ was almost half as the maximum value of the $\Delta T_{obs}$.

In contrary, in the case that the sample of Example 1-1 was driven so that the cooling is performed with a direct pulse current applied thereto, which is 1.5 times larger than the case that the specimen was driven with the constant electric current, the $\Delta T_{obs}$ was almost the same as the case that the specimen was driven with the constant electric current. In addition, after one minute, the generated temperature difference $\Delta T_{obs}$ was maintained at 70% of the maximum value of the $\Delta T_{obs}$.

The direct pulse current input in this case was a rectangular-shaped pulse that was 1 msec in width and repeated at an interval of 10 msec.

Furthermore, when the shape of the direct pulse current was changed to a precipitous saw shape on the leading edge only, the $\Delta T_{obs}$ after one minute improved to 80% of the maximum value of the $\Delta T_{obs}$.

It can be understood that the reason why the direct pulse current prevented the alleviation of the $\Delta T_{obs}$ would be that a total Joule heat amount was smaller than the case that the specimen was driven with the constant electric current applied thereto.

Example 2

As the material layer 22, a single crystal of a layered oxide expressed by a composition formula of $Ca_3Co_4O_y$ (y=8.5 to 9.5, and hereinafter, referred to as "CCO") was used for producing a thermoelectric conversion device of this example. It is noted that in this example, the thermoelectric conversion device shown in FIG. 2 was produced.

CCO is a layered oxide having an insulating layer composed of a 3-layered rock halt structure. In CCO, the electric conductivity in an intralayer direction is approximately 100 times higher than that in an interlayer direction.

The single crystal of the CCO was produced by a floating zone method. First, CaO and $Co_3O_4$ were weighed according to the above-described composition, and thereafter, CaO and $Co_3O_4$ were mixed. Subsequently, the mixture was sintered at 1000° C. for 24 hours in an atmosphere so that the mixture was once again in a powdered form. The resultant powder was pressed, and sintered while being maintained at 1150° C. for 15 hours, after which it was crystallized to be grown in an oxygen atmosphere of 3 atmospheres. As a result, a single crystal of 7 to 8 mm in length, 7 mm in radius, and with luster in black was obtained.

The crystalline structure of the resultant substance was confirmed by the X-ray diffraction.

The composition of the resultant single crystal was confirmed by using analysis of ICP (Inductively Coupled Plasma) and EDX (Energy Dispersive X-ray).

The real amount of oxygen in the single crystal is y=9 if ideally composed according to the composition formula. It is, however, difficult to identify the amount of oxygen even if the ICP and the EDX are used. Therefore, y is in a range of 8.5 to 9.5.

The single crystal thus produced was cleaved, and thereby, a rectangular parallelepiped material layer 22 of 2.0 mm×2.0 mm×0.2 mm in size was obtained.

At this time, a Laue diffraction confirmed that the surface of 2.0 mm×2.0 mm had a (001) surface parallel to a layer of the crystalline structure of CCO.

After one pair of surfaces of 2.0 mm×2.0 mm was smoothed, the first electrode 21 (Ag) was formed on the entire surface ($4.0 \times 10^6$ $\mu m^2$) of one surface by a magnetron sputtering method.

The second electrode 23 (Al) was vaporized on the other surface.

At this time, similar to the case of the example 1, the film formation was performed via a metal mask having one circular hole. Samples were produced so that diameters were 30 $\mu m$ ($7.1 \times 10^2$ $\mu m^2$ in area), 50 $\mu m$ ($2.0 \times 10^3$ $\mu m^2$ in area), 100 $\mu m$ ($7.9 \times 10^3$ $\mu m^2$ in area), and 500 $\mu m$ ($2.0 \times 10^5$ $\mu m^2$ in area), respectively (Comparative Examples 2-1 to 2-4).

As a comparative example, a sample in which the second electrode 23 (Al) was formed on the entire surface area ($4.0 \times 10^6$ $\mu m^2$ in area) of the material layer 22 was produced without using the metal mask (Comparative Example 2-1).

As other comparative examples, samples of the Comparative Examples 2-2 to 2-5 were produced as follows: the single crystal of CCO was cut into rectangular parallelepipeds of 2.0 mm×2.0 mm×0.2 mm; among these rectangular parallelepipeds, samples of which surfaces of 2.0 mm×2.0 mm were (100) surfaces of CCO were used; and other than this condition, the samples were configured similar to the cases of Examples 2-1 to 2-4.

Regarding the samples of Examples 2-1 to 2-4 and Comparative Examples 2-1 to 2-5 thus produced, an electric current in a range of 0.01 mA to 100 mA was applied between the first electrode 21 and the second electrode 23, and a generated temperature difference was evaluated.

The results are shown in Table 2.

TABLE 2

| Samples | Orientation of an electrode interface to layered structure | Area ratio between first electrode 21 and the second electrode 23 (area of second electrode/area of first electrode) | $\Delta T_{obs}$(K) | $\Delta T_{obs}/\Delta T_{max}$ | $S_{obs}$ ($\mu V/K$) |
|---|---|---|---|---|---|
| Ex. 2-1 | parallel | $1.775 \times 10^{-4}$ | 12.0 | 45.9 | 814 |
| Ex. 2-2 | parallel | $5.0 \times 10^{-4}$ | 9.21 | 35.3 | 713 |
| Ex. 2-3 | parallel | $1.975 \times 10^{-3}$ | 6.09 | 23.3 | 579 |
| Ex. 2-4 | parallel | 0.05 | 1.51 | 5.8 | 289 |
| Comparative Ex. 2-1 | parallel | 1.0 | 0.26 | 1.0 | 120 |
| Comparative Ex. 2-2 | perpendicular | $1.775 \times 10^{-4}$ | 0.43 | 1.7 | 154 |
| Comparative Ex. 2-3 | perpendicular | $5.0 \times 10^{-4}$ | 0.38 | 1.5 | 145 |
| Comparative Ex. 2-4 | perpendicular | $1.975 \times 10^{-3}$ | 0.32 | 1.2 | 133 |
| Comparative Ex. 2-5 | perpendicular | 0.05 | 0.28 | 1.1 | 125 |

The table 2 also shows the ratio of $\Delta T_{obs}/\Delta T_{max}$ (where $\Delta T_{obs}$ is the maximum cooling temperature that is obtained by applying an electric current to each sample having the upper electrode of which diameter differs to each other so that the upper electrode was cooled, and $\Delta T_{max}$ is the upper limit of the cooling temperature that is evaluated according to the equation of $\Delta T_{max} = Z_0 T^2/2$ by using the figure of merit $Z_0$ of the material itself), and the effective Seebeck coefficient $S_{obs}$ calculated from $\Delta T_{obs}$.

The evaluation of the Seebeck coefficient Ss of CCO by the steady method revealed that the Seebeck coefficient Ss was approximately 120 $\mu V/K$ at room temperature. Compared to the Ss, the $S_{obs}$ of this example improved by approximately 6.8 times.

On the other hand, the $S_{obs}$ in Comparative Examples 2-1 to 2-5 were 120 to 154 $\mu V/K$, approximately the same values as the values Ss by the steady method.

Each of $Sr_3Co_4O_9$, CCO, and $Sr_3Co_4O_9$, each of which has the approximately same crystalline structure as that of CCO, is substituted with Bi. Samples of resultant $Ca_{2.7}Bi_{0.3}Co_4O_9$, $Sr_{2.7}Bi_{0.3}Co_4O_9$, and $Ca_2Sr_{0.7}Bi_{0.3}Co_4O_9$ were produced. As a result of evaluation, each showed a similar tendency to CCO.

Example 3

The thermoelectric conversion device of this example was produced by an RF magnetron sputtering method and a liquid phase epitaxy method. It is noted that the thermoelectric conversion device configured as shown in FIG. 2 was produced.

A thermoelectric conversion device using $SrRuO_3$ of 200 nm in thickness as the lower electrode, which is the first electrode 21; $Sr_xCoO_y$ (hereinafter, referred to as SCO) of 200 μm in thickness as the material layer 22; and Ti of 1000 nm in thickness as the upper electrode, which is the second electrode 23, was produced.

SCO is a layered oxide having an insulating layer composed of a monolayer of Sr atoms. The electric conductivity in an intralayer direction is approximately 40 times better than that in an interlayer direction.

Ideally, an amount of oxygen in SCO is y=2. However, depending on forming conditions, oxygen nonstoichiometry on the order of plus or minus 0.5 may occur. Therefore, y is considered to be in a range of $1.5 \leq y \leq 2.5$.

It is noted that x is adjustable in a range of 0.1 to 0.8 depending on the basis weight of a material.

In this example, SCO of which x is approximately 0.3 was formed.

As a substrate, a (111) surface substrate of $SrTiO_3$ that is 10 mm square and 500 μm in thickness was used.

The first electrode 21 ($SrRuO_3$) was formed on the entire surface ($1.0 \times 10^8$ μm² in area) of the substrate.

The conditions for forming the first electrode 21 were as follows: a substrate temperature was 750° C.; a gas pressure at a time of growth was 3 Pa; as an atmosphere gas, a mixed gas of 70% Ar and 30% oxygen (in a partial pressure ratio) was used; and an input electric power was 100 W.

The evaluation results of an X-ray diffraction revealed that $SrRuO_3$ was epitaxially grown in a (111) orientation.

The material layer 22 composed of SCO was formed by, first, stacking template layers of 100 nm in thickness by using the RF magnetron sputtering method, and thereafter, by forming an SCO thick film of 200 μm in thickness by the liquid epitaxy method.

The conditions of the RF magnetron sputtering were as follows: a substrate temperature was 650° C.; a gas pressure at a time of growth was 5 Pa; and an input electric power was 60 W under a mixed gas atmosphere of 80% Ar and 20% oxygen.

After completion of the film formation, the inside of the sputtering device was set to a pure oxygen atmosphere of 81 kPa (0.8 atm), and it took five hours to cool the sample to room temperature.

The evaluation results of an X-ray diffraction revealed that SCO was a single crystalline thin film that was epitaxially grown in a (001) orientation.

Thereafter, raw material powders of $SrO_2$ and $Co_3O_4$ were melted in a flux composed of KCl so that melt was produced. The sample was impregnated with the melt, which was slowly cooled while being rotated. Thereby, an SCO thick film of 200 μm in thickness was obtained.

The X-ray diffraction revealed that the resultant SCO thick film was (001)-oriented. That is, the layered structure of SCO was parallel to the substrate surface (in-plane direction of each layer of SCO was parallel to the substrate surface).

The conditions for forming the second electrode 23 (Ti) were as follows: a substrate temperature was room temperature; a gas pressure at a time of growth was 1 Pa; an atmospheric gas was composed solely of Ar; and an input electric power was 80 W.

At this time, the film forming was performed via a metal mask having one circular hole. A total of four samples were produced so that respective electrodes were 3 μm, 10 μm, 50 μm, and 200 μm in diameter (7.1 μm², $7.9 \times 10^1$ μm², $2.0 \times 10^3$ μm², and $3.1 \times 10^4$ μm² in area) (Examples 3-1 to 3-4).

Furthermore, as a comparative example, a sample in which the second electrode 23 (Ti) was formed on the entire surface area ($1.0 \times 10^8$ μm² in area) of CCO was formed without using the metal mask (Comparative Example 3-1).

As other comparative examples, $SrRuO_3$ (100)-oriented thin films were formed on $SrTiO_3$ (100) substrates, and SCO were formed on top thereof, according to the similar conditions to the cases of Examples 3-1 to 3-4.

The evaluation results of an X-ray diffraction revealed that the SCO thin film was a polycrystalline thin film that had no orientation.

As the upper electrodes (Ti), samples of 3 μm, 10 μm, 50 μm, and 200 μm in diameter (7.1 μm², $7.9 \times 10^1$ μm², $2.0 \times 10^3$ μm², and $3.1 \times 10^4$ μm² in area) were formed, similar to the cases of Examples 3-1 to 3-4 (Comparative Examples 3-2 to 3-5).

Regarding the samples of Examples 3-1 to 3-4 and Comparative Examples 3-1 to 3-5 thus produced, an electric current in a range of 0.01 mA to 100 mA was applied between the first electrode 21 and the second electrode 23, and a generated temperature difference was evaluated.

The results are shown in Table 3.

TABLE 3

| Samples | Orientation of an electrode interface to layered structure | Area ratio between first electrode 21 and the second electrode 23 (area of second electrode/area of first electrode) | $\Delta T_{obs}$(K) | $\Delta T_{obs}/\Delta T_{max}$ | $S_{obs}$ (μV/K) |
|---|---|---|---|---|---|
| Ex. 3-1 | Parallel | $7.1 \times 10^{-8}$ | 12.73 | 63.7 | 654 |
| Ex. 3-2 | Parallel | $7.9 \times 10^{-7}$ | 7.11 | 35.6 | 489 |
| Ex. 3-3 | Parallel | $2.0 \times 10^{-5}$ | 3.91 | 19.6 | 363 |
| Ex. 3-4 | Parallel | $3.1 \times 10^{-4}$ | 2.26 | 11.3 | 275 |
| Comparative Ex. 3-1 | Parallel | 1.0 | 0.20 | 1.0 | 82 |
| Comparative Ex. 3-2 | Nonorientation | $7.1 \times 10^{-8}$ | 0.43 | 2.2 | 120 |
| Comparative Ex. 3-3 | Nonorientation | $7.9 \times 10^{-7}$ | 0.35 | 1.8 | 108 |

TABLE 3-continued

| Samples | Orientation of an electrode interface to layered structure | Area ratio between first electrode 21 and the second electrode 23 (area of second electrode/area of first electrode) | $\Delta T_{obs}$(K) | $\Delta T_{obs}/\Delta T_{max}$ | $S_{obs}$ ($\mu$V/K) |
|---|---|---|---|---|---|
| Comparative Ex. 3-4 | Nonorientation | $2.0 \times 10^{-5}$ | 0.30 | 1.5 | 100 |
| Comparative Ex. 3-5 | Nonorientation | $3.1 \times 10^{-4}$ | 0.25 | 1.3 | 92 |

The table 3 also shows the ratio of $\Delta T_{obs}/\Delta T_{max}$ (where $\Delta T_{obs}$ is the maximum cooling temperature that is obtained by applying an electric current to each sample having the upper electrode of which diameter differs to each other so that the upper electrode was cooled, and $\Delta T_{max}$ is the upper limit of the cooling temperature that is evaluated according to the equation of $\Delta T_{max} = Z_0 T^2/2$ by using the figure of merit $Z_0$ of the material itself), and the effective Seebeck coefficient $S_{obs}$ calculated from $\Delta T_{obs}$.

The evaluation of the Seebeck coefficient Ss of SCO by the steady method revealed that the Seebeck coefficient Ss was 82 $\mu$V/K at room temperature. Compared to the Ss, the $S_{obs}$ of this example improved by approximately 8 times.

On the other hand, the $S_{obs}$ in Comparative Examples 3-1 to 3-4 were 82 to 120 $\mu$V/K, which were approximately the same values as the values Ss by the steady method.

A sample of $Ca_{0.3}CoO_2$ having the approximately same crystalline structure as SCO was produced. As a result of evaluation, the sample showed a similar tendency to SCO.

Example 4

In Example 4, in order to enlarge an effective area, a thermoelectric conversion device configured such that a plurality of contact points between the material layer 22 and the second electrode 23 exist was produced, as shown in FIG. 4.

Processes for producing the thermoelectric conversion device of this example are shown in FIG. 8A to FIG. 8D.

As a substrate, a (111) surface substrate of $SrTiO_3$ that was 10 mm square and 500 $\mu$m in thickness was used.

$SrRuO_3$ was used for the first electrode 21. $Sr_xCoO_y$ (hereinafter, referred to as "SCO") was used for the material layer 22. Ti was used for the second electrode 23. A negative-type photosensitive polyimide was used for the insulating interlayer 41.

SCO was produced so that x would be approximately 0.3.

Figure 8A:
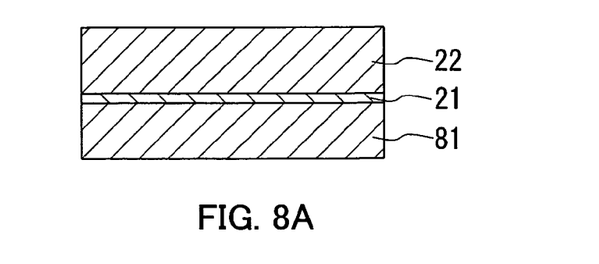
FIGS. 8A to 8D are cross sectional views showing processes for producing a thermoelectric conversion device in Embodiment 4.
Figure 8B:
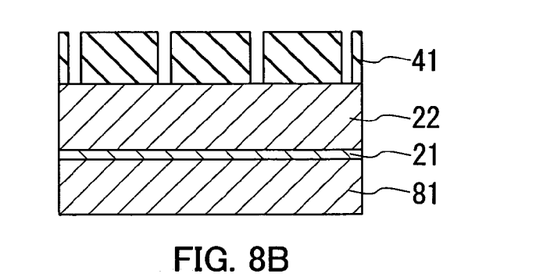

First, as shown in FIG. 8A, the first electrode 21 and the material layer 22 were formed on top of the entire surface ($1.0 \times 10^8$ $\mu$m$^2$ in area) of the substrate 81 according to the similar conditions to those described in the Example 3.

The first electrode 21 was 200 nm in thickness, and the material layer 22 was 200 $\mu$m in thickness.

In the case that the photosensitive polyimide was used for the insulating interlayer 41, a process similar to a generally-used photoresist patterning method can be applicable.

In this case, firstly, a raw material solution of the negative-type photosensitive polyimide was spin coated, and prebaked on a hot plate at 70° C. for three minutes, and thereafter, at 90° C. for three minutes so that the solvent was vaporized. Thereby, a film of 10 $\mu$m in thickness was obtained.

The sample thus produced was exposed with ultraviolet light of a mercury lamp via a photomask. Thereafter, after undergoing an exposing process in a mixed liquid of $\gamma$-butyrolactone and cyclohexanone and a rinse process in a mixed liquid of butyl acetate and cyclohexanone, the pattern shape of the insulating interlayer 41 having contact holes 51 shown in FIG. 8B was obtained.

Figure 8C:
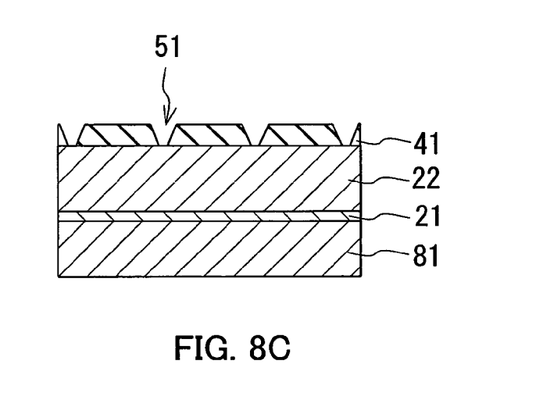

Furthermore, in order to change side walls of the contact holes 51 to a tapered shape, there was provided a baking process in which the sample was kept at 200° C. for 30 minutes and 350° C. for 30 minutes under a gas atmosphere of $N_2$. Thereby, the tapered shape as shown in FIG. 8C was formed.

The thickness of the insulating interlayer 41 after the baking was 6 $\mu$m.

The size and the arrangement of the contact holes 51 can be freely set depending on the pattern of the photomask in use. In this example, an insulating interlayer 41 in which circular contact hole patterns were arranged in such a manner as to be spaced at an equal distance to each other was produced as shown in FIG. 4B.

More specifically, a total of 1000 contact holes of 3 $\mu$m in diameter (contact holes of 7.1 $\mu$m$^2$ in area) at the interface between the material layer 22 and the second electrode 23 were arranged, as contact holes 51.

Figure 8D:
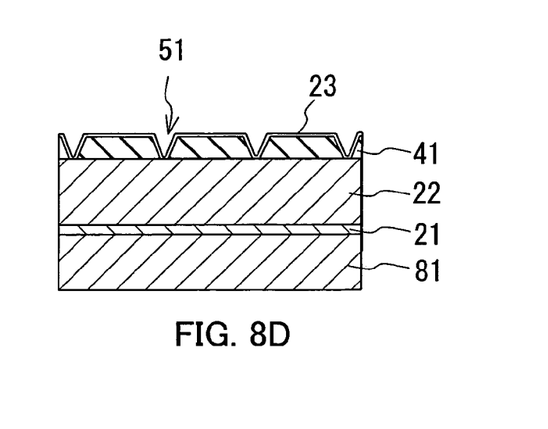

Subsequently, the second electrode 23 (Ti) was formed on the similar conditions to the Example 3, and a thermoelectric conversion device as shown in FIG. 8D was obtained (Example 4).

Regarding the thermoelectric conversion device of Example 4 thus produced, an electric current of 3 A was applied between the first electrode 21 and the second electrode 23 so that the cooling was performed.

In this case, a sheet heater was arranged on the second electrode 23, which is a cooling side, so that a predetermined temperature difference was maintained. Based on the consumed electric power of the sheet heat in this case, the cooling capacity (heat absorption amount per unit time) of the thermoelectric conversion device of this example was calculated.

The results are shown in Table 4.

TABLE 4

| Temperature difference (° C.) | Cooling power (mW) |
|---|---|
| 10 | 10 |
| 5 | 30 |
| 3 | 38 |
| 1 | 46 |

Table 4 shows a difference in cooling capacity in Example 4 when the temperature difference upon cooling was changed.

When the cooling is performed with a temperature difference of 5° C., for example, each device of this example can absorb a maximum of 30 mW of heat from a subject to be cooled.

These results revealed that use of a plurality of thermoelectric conversion devices of this example makes it possible to control the temperature of the subject to be cooled that has a large thermal capacity.

In the thermoelectric conversion device of this example, electric power can be retrieved from between the two electrodes when the temperature difference is applied between the first electrode 21 and the second electrode 23.

In the thermoelectric conversion device of this example, the power generation capacity was approximately 1 mW when a heat bath for keeping the temperature to room temperature was mounted on the first electrode 21 side and the sheet heater was mounted on the second electrode 23, and a temperature difference of 5° C. was provided.

The thermoelectric conversion device according to the present invention can realize a device having high efficiency for reducing a loss caused by thermal conduction. Furthermore, the conventional process for designing and manufacturing a thin film element can be applicable, so that it becomes easy to render the device thinner and more minute, and therefore, the thermoelectric conversion device of the present invention can be used as a thin cooling device or a power generator that did not exist in the past.

Furthermore, the thermoelectric conversion device can be assembled as one component of a circuit in an electronic device, so that a heated region in the circuit can be cooled more effectively than the conventional device.

As many apparently widely different examples of this invention may be made without departing from the spirit and scope thereof, it is to be understood that the invention is not limited to the specific examples thereof except as defined in the appended claims.

What is claimed is:

1. A thermoelectric conversion device, comprising:
   a first electrode;
   a second electrode; and
   a layered oxide arranged between the first electrode and the second electrode, wherein
   the first electrode, the layered oxide, and the second electrode are arranged in this order so that a multilayer is formed,
   the layered oxide is formed of electric conductive layers and electric insulating layers being alternately stacked,
   a C axis of the layered oxide is perpendicular to an interface between the first electrode and the layered oxide, and
   an area of the second electrode is smaller than that of the first electrode.

2. The thermoelectric conversion device according to claim 1, wherein the device functions as a cooling element by applying an electric current between the first electrode and the second electrode.

3. The thermoelectric conversion device according to claim 2, wherein the electric current is a pulse current.

4. The thermoelectric conversion device according to claim 1, wherein the device functions as a power generation element by a temperature difference applied between the first electrode and the second electrode.

5. The thermoelectric conversion device according to claim 1, wherein an area ratio of the second electrode to the first electrode is in a range of $1.0 \times 10^{-5}$ to 0.05.

6. The thermoelectric conversion device according to claim 5, wherein the area ratio of the second electrode to the first electrode is $2.0 \times 10^{-3}$ or less.

7. The thermoelectric conversion device according to claim 6, wherein the area ratio of the second electrode to the first electrode is $5.0 \times 10^{-4}$ or less.

8. The thermoelectric conversion device according to claim 1, wherein
   the electric conductive layer contains a cobalt oxide, and
   the electric insulating layer contains at least one element selected from the group consisting of alkaline metal elements, alkaline-earth metal elements, Bi, and Pb.

9. The thermoelectric conversion device according to claim 1, wherein when M denotes a metal element, the electric conductive layer is formed of $MO_2$ octahedrons in which ridges are shared.

10. The thermoelectric conversion device according to claim 9, wherein M is Co.

11. The thermoelectric conversion device according to claim 1, wherein
    a composition formula of the layered oxide is $Bi_{2-x}Pb_xSr_2Co_2O_y$ ($0 \leq x \leq 0.5$, $7.5 \leq y \leq 8.5$),
    the electric conductive layer is formed of $CoO_2$ octahedrons in which ridges are shared, and
    the electric insulating layer is formed of a rock salt-type insulating layer composed of four atomic layers.

12. The thermoelectric conversion device according to claim 1, wherein
    a composition formula of the layered oxide is $((Ca_{1-x1}Sr_{x1})_{1-x2}Bi_{x2})_3Co_4O_y$ ($0 \leq x1 \leq 1$, $0 \leq x2 \leq 0.3$, $8.5 \leq y \leq 9.5$),
    the electric conductive layer is formed of $CoO_2$ octahedrons in which ridges are shared, and
    the electric insulating layer is formed of a rock salt-type insulating layer composed of three atomic layers.

13. The thermoelectric conversion device according to claim 1, wherein
    a composition formula of the layered oxide is $(Ca_{1-x1}Sr_{x1})_{x2}CoO_y$ ($0 \leq x1 \leq 1$, $0.1 \leq x2 \leq 0.8$, $1.5 \leq y \leq 2.5$),
    the electric conductive layer is formed of $CoO_2$ octahedrons in which ridges are shared, and
    the electric insulating layer is formed of a rock salt-type insulating layer composed of one atomic layer.

14. The thermoelectric conversion device according to claim 1, comprising a plurality of the second electrodes.

15. A cooling method comprising:
    providing the thermoelectric conversion device of claim 1, and
    generating a temperature difference between the first electrode and the second electrode by application of a voltage between the first and second electrode so that an electric current is passed therethrough, whereby either one of the first electrode or the second electrode is made a lower temperature part.

16. A method of generating power comprising:
    providing the thermoelectric conversion device of claim 1, and
    generating a potential difference between the first electrode and the second electrode by providing a temperature difference between the first electrode and the second electrode.

* * * * *

UNITED STATES PATENT AND TRADEMARK OFFICE
CERTIFICATE OF CORRECTION

PATENT NO. : 7,446,256 B2
APPLICATION NO. : 11/643708
DATED : November 4, 2008
INVENTOR(S) : Tsutomu Kanno et al.

Page 1 of 1

It is certified that error appears in the above-identified patent and that said Letters Patent is hereby corrected as shown below:

In Column 22, Line 3 (Claim 6), change "$2.0 \times 10_{-3}$" to --$2.0 \times 10^{-3}$--.

Signed and Sealed this

Twenty-fourth Day of March, 2009

JOHN DOLL
*Acting Director of the United States Patent and Trademark Office*